(12) United States Patent
Granneman et al.

(10) Patent No.: US 6,607,602 B1
(45) Date of Patent: Aug. 19, 2003

(54) DEVICE FOR PROCESSING SEMICONDUCTOR WAFERS

(75) Inventors: Ernst Hendrik August Granneman, Hilversum (NL); Albert Hasper, Meppel (NL); Jan Zinger, Dwingeloo (NL)

(73) Assignee: ASM International N.V., Bilthove (NL)

(*) Notice: Subject to any disclaimer, the term of this patent is extended or adjusted under 35 U.S.C. 154(b) by 146 days.

(21) Appl. No.: 09/355,509

(22) PCT Filed: Jan. 27, 1998

(86) PCT No.: PCT/NL98/00055
§ 371 (c)(1),
(2), (4) Date: Oct. 12, 1999

(87) PCT Pub. No.: WO98/36444
PCT Pub. Date: Aug. 20, 1998

(30) Foreign Application Priority Data

Jan. 27, 1997 (NL) .............................................. 1005102

(51) Int. Cl.⁷ ........................ C23C 16/00; H01L 21/00; B65G 69/00

(52) U.S. Cl. ..................... 118/719; 29/25.01; 29/25.02; 414/935

(58) Field of Search ................................ 118/719, 715, 118/500, 724; 29/25.01, 25.02; 414/935

(56) References Cited

U.S. PATENT DOCUMENTS

| | | | | |
|---|---|---|---|---|
| 5,178,639 A | * | 1/1993 | Nishi ........................ 29/25.02 |
| 5,180,273 A | * | 1/1993 | Sakaya et al. .............. 414/404 |
| 5,407,449 A | | 4/1995 | Zinger |
| 5,464,313 A | * | 11/1995 | Ohsawa ....................... 414/172 |
| 5,855,681 A | * | 1/1999 | Maydan et al. ............. 118/719 |

* cited by examiner

*Primary Examiner*—Parviz Hassanzadeh
(74) *Attorney, Agent, or Firm*—Knobbe, Martens, Olson & Bear, LLP (57) ABSTRACT

Device for processing semiconductor wafers, comprising at least one processing chamber which is completely closed with the exception of a connection to a distribution. System. In said at least one processing chamber there are situated preferably two reactors and a common feed/removal system in order to be able to subject wafers, which may optionally be arranged in boats, to an identical processing operation.

22 Claims, 7 Drawing Sheets fig-1

(prior art)

fig-2 fig-3 fig-4a fig-4b fig-4c fig-6

DEVICE FOR PROCESSING SEMICONDUCTOR WAFERS

The present invention relates to a device in accordance with the preamble of claim 1.

The present invention relates to a device for processing semiconductor wafers, comprising at least one processing chamber with an gaslock system, a reactor, as well as feed and removal means for transferring said semiconductor wafers to and from the said reactor, being arranged in the said at least one processing chamber.

A device or this kind is known from U.S. Pat. No. 5,407,449 in the name of the applicant. In this device, a number of processing chambers is arranged around a centrally disposed distributing system or robot structure. From this centrally disposed robot, semiconductor wafers are transferred onto turntables which are situated in each of the processing chambers. In general, this takes place by the transfer of semiconductor wafers arranged in cassettes in the feed station or in a boat on a turntable in one of the processing chambers to a boat arranged a turntable in the other of the processing chambers.

SUMMARY OF THE INVENTION

A processing operation is carried out in each processing chamber, such as the doping of specific substances and the removal and/or application of (parts of) layers at elevated temperature. It is then necessary to allow the wafers to cool under controlled conditions before further processing operations can take place. Cooling of this nature may take place inside the processing chamber in question, but may equally be carried out in another processing chamber.

In the art, there is a constant desire to enlarge the semiconductor wafers further, i.e. for ever more extensive integration. As a result, the value of a series of semiconductor wafers in a boat is constantly increasing, especially for small batches, and the financial risk associated with the failure of a specific processing operation is constantly rising. Moreover, there is a demand for the capacity of devices for processing semiconductor wafers to be increased.

One proposal in the prior art comprises the provision of different processing chambers, which are each closed and each perform the same processing operation. This means that a specific series of semiconductor wafers is fed to a processing chamber, where it undergoes a processing operation, while another series is fed to another processing chamber, where it undergoes the same processing operation. This provides an initial saving, since it is possible to make use of the common robot or the common distributing system and the common feed and removal from the system. It has been found that, although a system of this kind functions in certain cases, primarily where the residence time of the semiconductor wafers in the processing chambers is relatively long, in many applications the capacity of the distributing system, and more particularly the robot arranged therein, forms the bottleneck in the capacity of a device of this kind.

By also placing a boat with semiconductor wafers to be processed in the "waiting position" in a system of this kind, three positions are provided in a processing chamber of this kind, with the result that optimum utilization can be achieved. This means that three boats are present on a turntable. It will be understood that this number can be greater.

U.S. Pat. No. 5,464,313 discloses a stand alone oven assembly comprising two adjacent ovens which are provided with boats of wafers by a single, linear operating system. This structure is not a space-saving one, and also cannot be used in the compact cluster structure as described in U.S. Pat. No. 5,407,449.

The object of the present invention is to increase further the processing capacity of a device described above without it being necessary to extend the distributing system and while utilizing the floor area in question as efficiently as possible. This is important because the device will generally be arranged in a clean room.

An object of the invention is a device for processing semiconductor wafers including a processing chamber. The processing chamber comprises a central distributing system for transferring wafers between a store or another processing chamber and a boat on a turntable in the processing chamber. The processing chamber is configured to be closed with respect to the central distributing system. The processing chamber comprises further a first reactor, first feed and removal means for transferring the boat with the semiconductor wafers from the turntable into the first reactor arranged in the processing chamber, at least a second reactor arranged within the processing chamber, and second feed and removal means for transferring the semiconductor wafers from the turntable into the second reactor.

Surprisingly, it has been found that arranging two reactors in one processing chamber, i.e. no longer separated by the distributing system, allows the capacity to be increased considerably without substantially enlarging the floor area. Moreover, it is not necessary to provide separate retention for the reactors, so that the cost price is reduced. This inventive idea may optionally be combined with further processing stations, as known for example from U.S. Pat. No. 5,407,449. According to the invention, when feeding semiconductor wafers to the boat on the turntable of the processing chamber in question, preferably a first series of semiconductor wafers is processed by the first reactor and a second series of semiconductor wafers is processed by the second reactor, in which case the processing operation in these two reactors may be identical. The processing chambers can be loaded using the turntable structure which is known from U.S. Pat. No. 5,407,449, i.e. it is possible to use a turntable which has three positions for the boats. In this case, if the cooling is important, a substantial part of the waiting time of the semiconductor wafers is taken away before they can be removed from the reactor. This can be resolved, on the one hand, by providing a turntable with four positions for the cassettes, but in other cases this will not be important, because the ratio between the cooling time and the processing time is such that the processing time is longer than half the cooling time, so that sufficient time remains to take the cooled semiconductor wafers out of the processing chamber and to replace them with wafers to be processed.

The reactors may comprise any type of reactor, but preferably comprise two processing ovens. It will be understood that the idea according to the invention can be extended to a processing chamber in which there are three or more reactors. In that case, the turntable will have to have more than three positions, or else the structure with the turntable will need to be designed differently.

Obviously, in the structures described above, as in U.S. Pat. No. 5,407,449, in addition to a turntable there is also a lifting means for each reactor in order to remove the relevant boat from the turntable and introduce it into the reactor and then to remove it again from the reactor.

BRIEF DESCRIPTION OF THE DRAWINGS

The invention will be explained in more detail below with reference to exemplary embodiments which are illustrated in the drawing, in which.

DETAILED DESCRIPTION OF THE INVENTION

Figure 1:
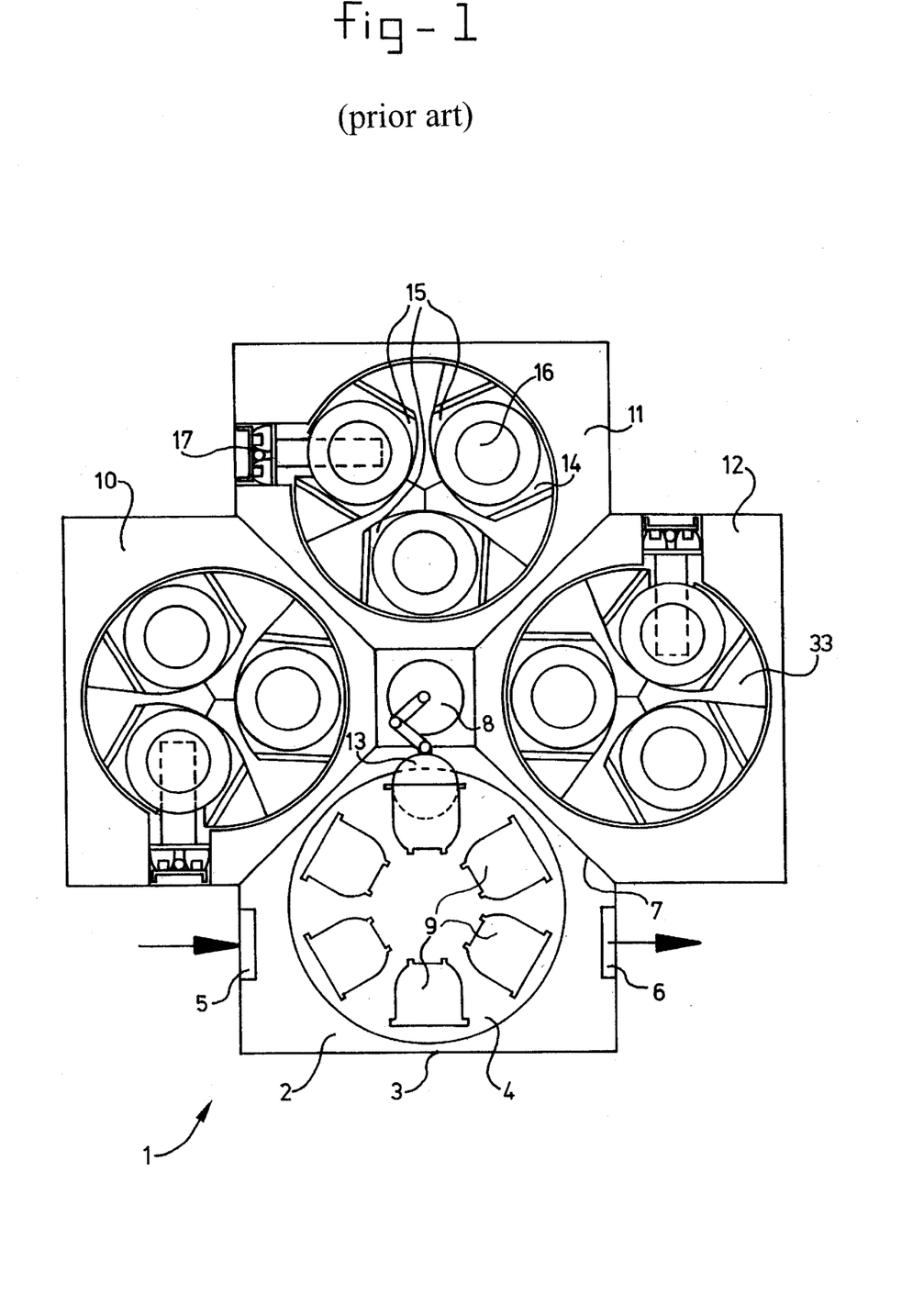
FIG. 1 shows a diagrammatic plan view of a device according to the prior art.

The device illustrated in FIG. 1 is intended for processing wafers comprising microcircuits, which are generally referred to by the expression semiconductor wafers. These semiconductor wafers are subjected to a number of treatments in order to form integrated circuits on their surface, which are later cut out of the wafer and processed further.

The use of the device 1 shown in FIG. 1 allows three, possibly successive, processing operations to be carried out on wafers of this kind.

It is usual to transport the wafers in cassettes, a number of which 9 are shown in plan view in FIG. 1 in the feed station 2. Feed station 2 comprises a turntable 4, in which 6 cassettes of this kind can be placed at three different levels, so that this table 4 can comprise a total of eighteen cassettes.

The feed unit 2 is connected, via wall 3 to a clean room in which an atmosphere with a very low dust level is maintained. The cassettes 9 can be placed on the turntable 4 via an inlet point 5. The inlet point 5 may be connected to a special feed unit (not shown) which comprises an gaslock, thus ensuring that no undesirable gases, in particular oxygen, enter into the device 1 when the cassettes are introduced.

As is clear from FIG. 1, the unit 2 has in cross-section an at least partially regular polygonal periphery, i.e. three walls of unit 2 in FIG. 1 form part of a regular octagon in cross-section. The processing stations 10, 11 and 12 likewise have an at least partially regular polygonal periphery in cross-section. The units 2, 10, 11 and 12 are designed as separate units which are connected to other units in the region of the sides, such as side 7 of the regular polygonal periphery.

In the device 1, the central unit is formed by the distributing unit 8, which comprises a robot unit. This robot unit 8 can take wafers 13 out of cassettes 9 and place them in carriers for wafers, such as boats, in the processing stations 10, 11 and 12. After the processing operation, the robot 8 again removes the processed wafers from the boats of the processing station and places them in a subsequent processing station or in an empty cassette 9 which has been placed in a specific position by means of the turntable 4. The cassettes 9 with processed wafers 13 can be removed from the feed station 2 via exit 6, which may comprise a separate exit station having, for example, a gaslock in the same way as inlet point 5.

Each of the processing chambers 10, 11, 12 contains a reactor (not shown in more detail) which is situated above the plane of the drawing. It is arranged above a lifting device 17 which transfers a boat containing semiconductor wafers from the turntable 33 into the reactor, such as an oven, which is not shown in more detail.

This means that starting from the position in which a boat is situated opposite robot 8 this boat is filled with wafers arriving from the relevant cassette 9 of unit 2 or one of the preceding processing chambers. After the boat in question has been filled, table 33 is rotated one position, it being possible for the boat in question to be brought into engagement with the lifting means 17 and to be placed in the oven. After being processed in the oven, the boat in question is placed back on table 33 and conveyed one position further for the purpose of cooling the semiconductor wafers situated therein. At the same time, a subsequent boat of semiconductor wafers is loaded into the reactor. After a subsequent rotation, the boat containing at least partially cooled semiconductor wafers is situated in front of robot 8 and can be unloaded into the cassettes in unit 2 or into a boat of a subsequent processing chamber.

Figure 2:
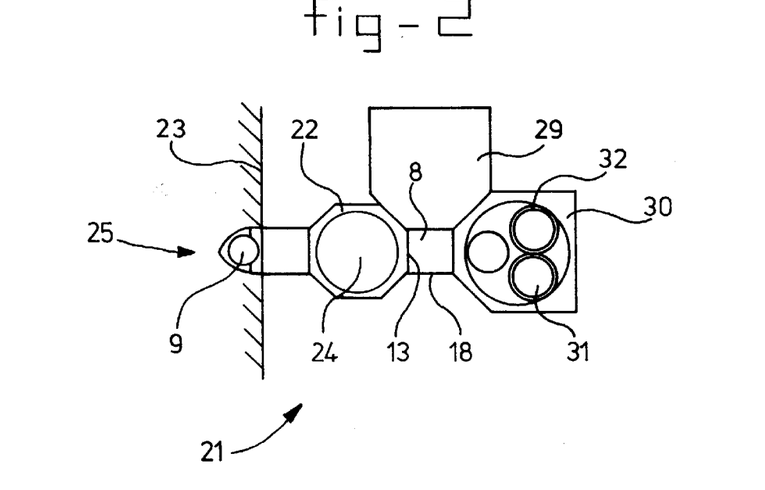
FIG. 2 shows a diagrammatic plan view of part of the device in accordance with FIG. 1 in an amended version also incorporating the structure according to the invention.

According to the invention it is proposed to optimize the processing time using a device of this kind, i.e. to be able to subject a large number of wafers to the same processing given the amount of floor area available. It is also advantageous here that it is possible to use the same distributing system, i.e. the structure containing robot 8, and the same entry system. The proposal according to the invention is illustrated in FIG. 2. In that figure, the device according to the invention is denoted overall by 21 and the entry and exit by 25. A cassette 9 containing wafers 13 is introduced into the device and the partition from the clean room is indicated by 23. The table, which is comparable to table 4 in accordance with FIG. 1, is now denoted by 24, and via this table the cassettes are placed opposite gaslock system 18, in which there is a robot 8, as in FIG. 1. In FIG. 2, only two processing stations 29 and 30 are shown, processing station 29 being illustrated only diagrammatically. It should be understood that more processing stations may be present, as shown, for example, in FIG. 1. By adapting the form, it is possible to use a considerably greater number of processing stations.

Figure 3:
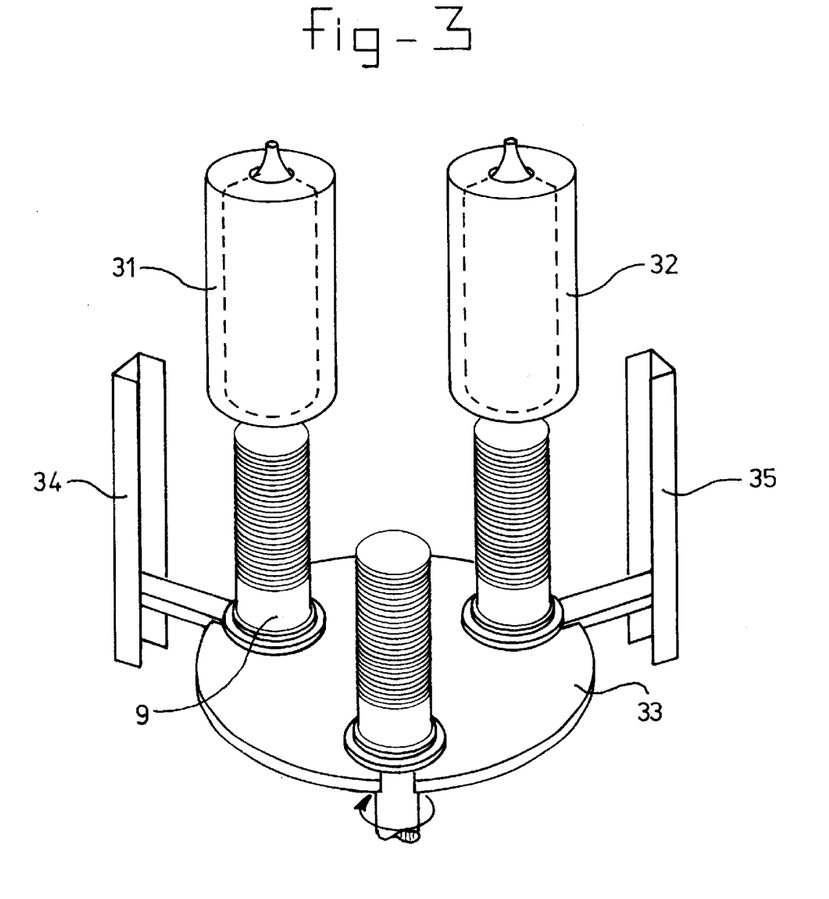
FIG. 3 shows a perspective view of part of the device in accordance with FIG. 2.

The design of processing chamber 30 will now be discussed. For this purpose, reference is also made to FIG. 3. It can be seen from this figure that in contrast to the prior art two reactors 31 and 32 are provided. Moreover lifting devices 34 and 35, which are illustrated only diagrammatically, for boats 19 are present. The chamber is fed by a common turntable 33 which, as in the prior art, has only three positions for receiving boats.

Figure 4A:
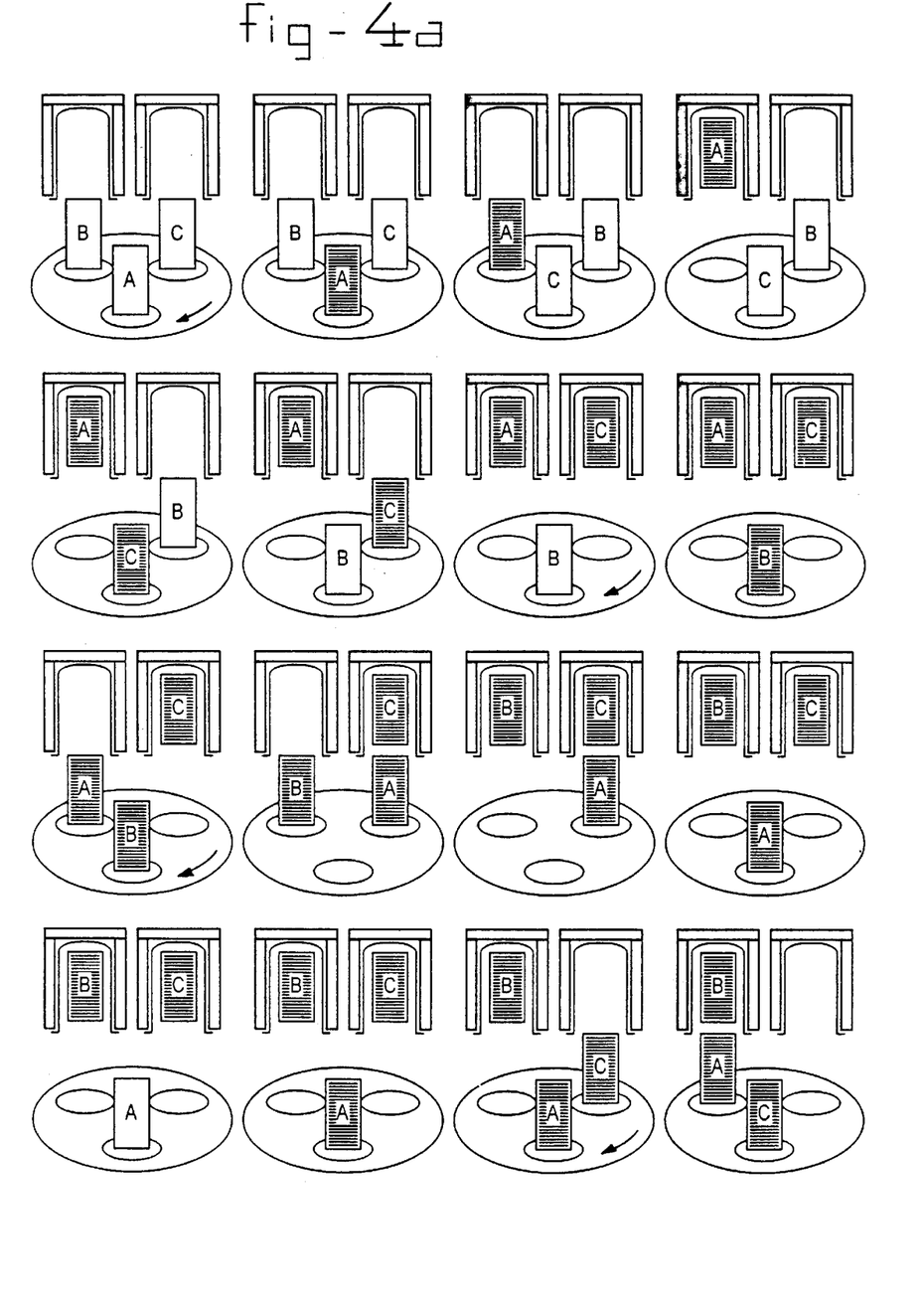
FIGS. 4a–c show a method of loading and unloading the processing chamber according to the invention.
Figure 4B:
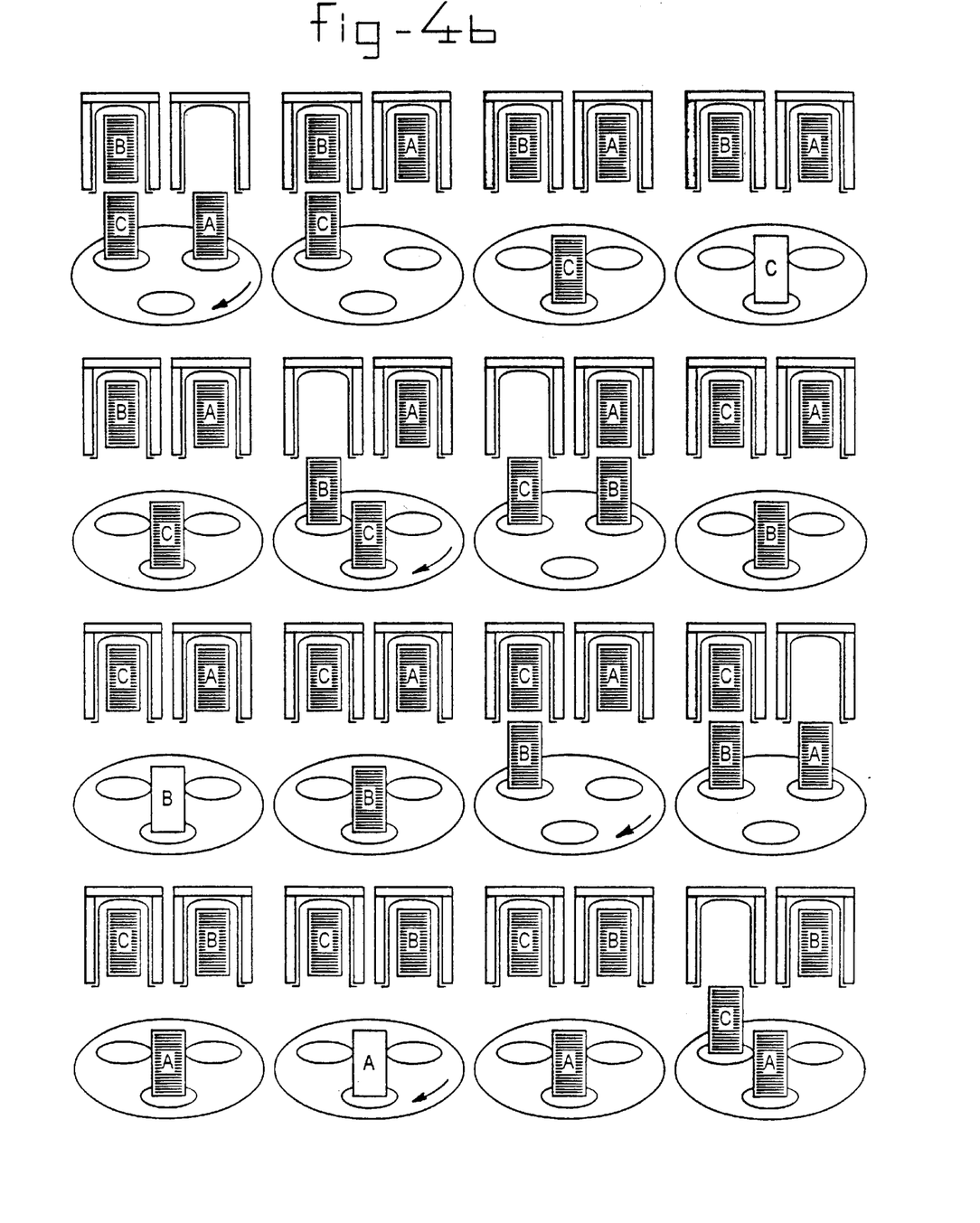
Figure 4C:
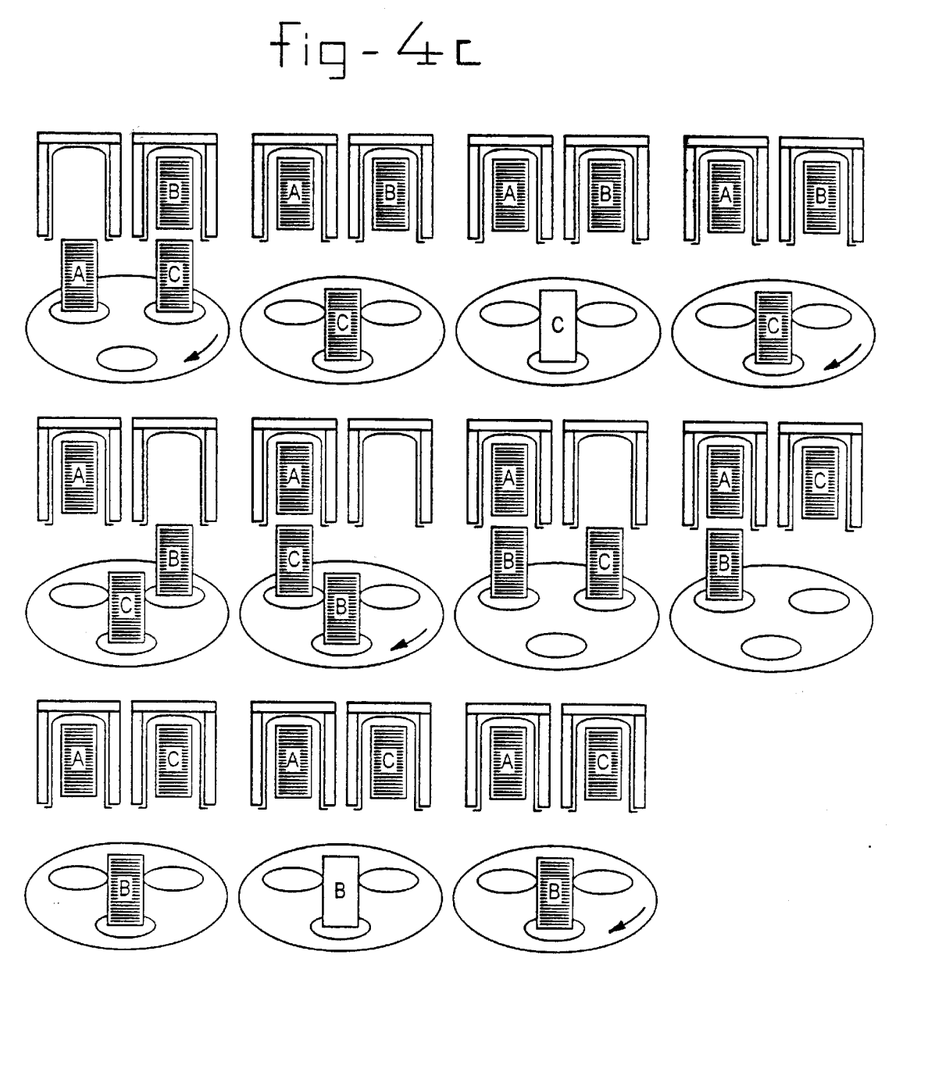

The progress of receiving wafers in the boats A, B and C is illustrated by way of example in FIGS. 4a–c, the direction of rotation of the table 33 being indicated by an arrow.

If the cooling time plays a relatively major role in the processing, it is possible to provide the turntable with four positions for receiving boats. In such a case, the series of processing operations as in FIGS. 4a–c will be amended.

It will be clear to the person skilled in the art that numerous variants are possible for operating the various reactors, in particular the feed and removal of semiconductor wafers arranged in the boats.

Although it is preferred to carry out the same processing operation in the ovens 31 and 32, it is quite conceivable to carry out different operations in these ovens.

It is clear from the above that simply by adding a reactor, such as an oven 32, and associated lifting device 35 it is possible to increase the capacity of a processing chamber considerably without substantially enlarging the area of the device and without requiring further technically complicated measures which increase the cost price.

Figure 5:
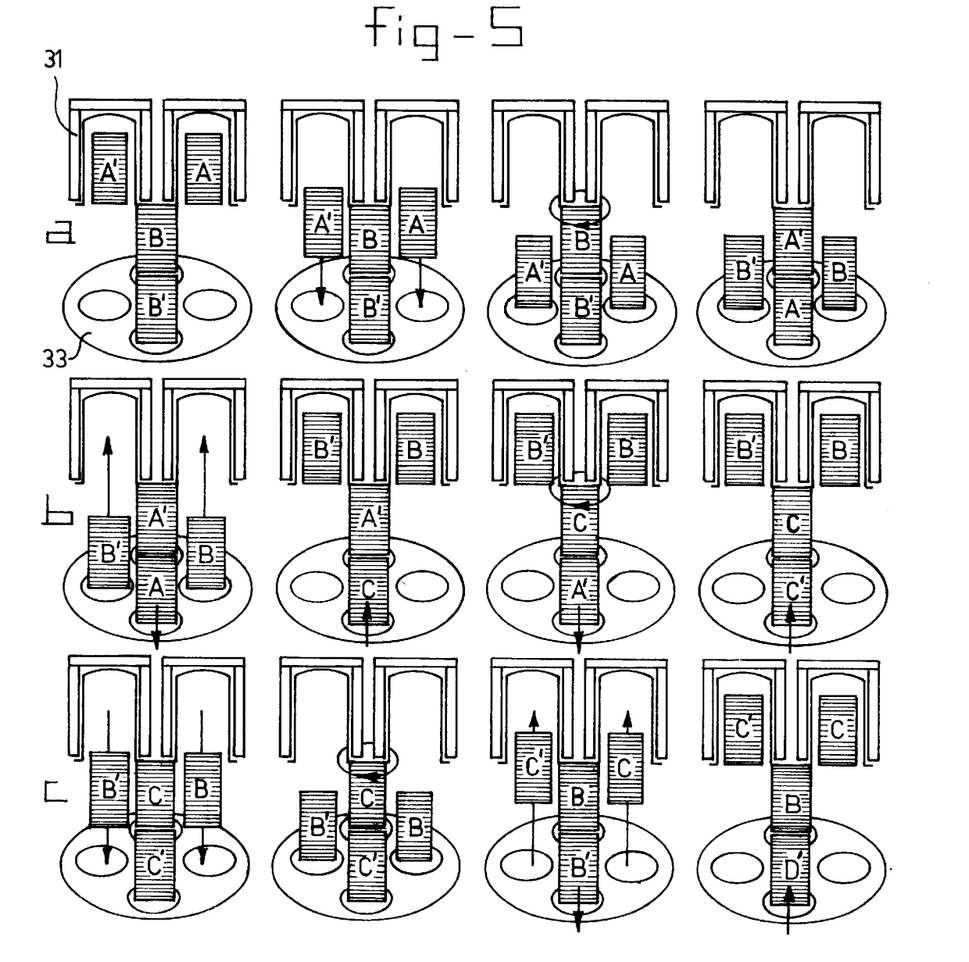
FIGS. 5a–c show the functioning of a first variant of the device according to the invention.
Figure 6:
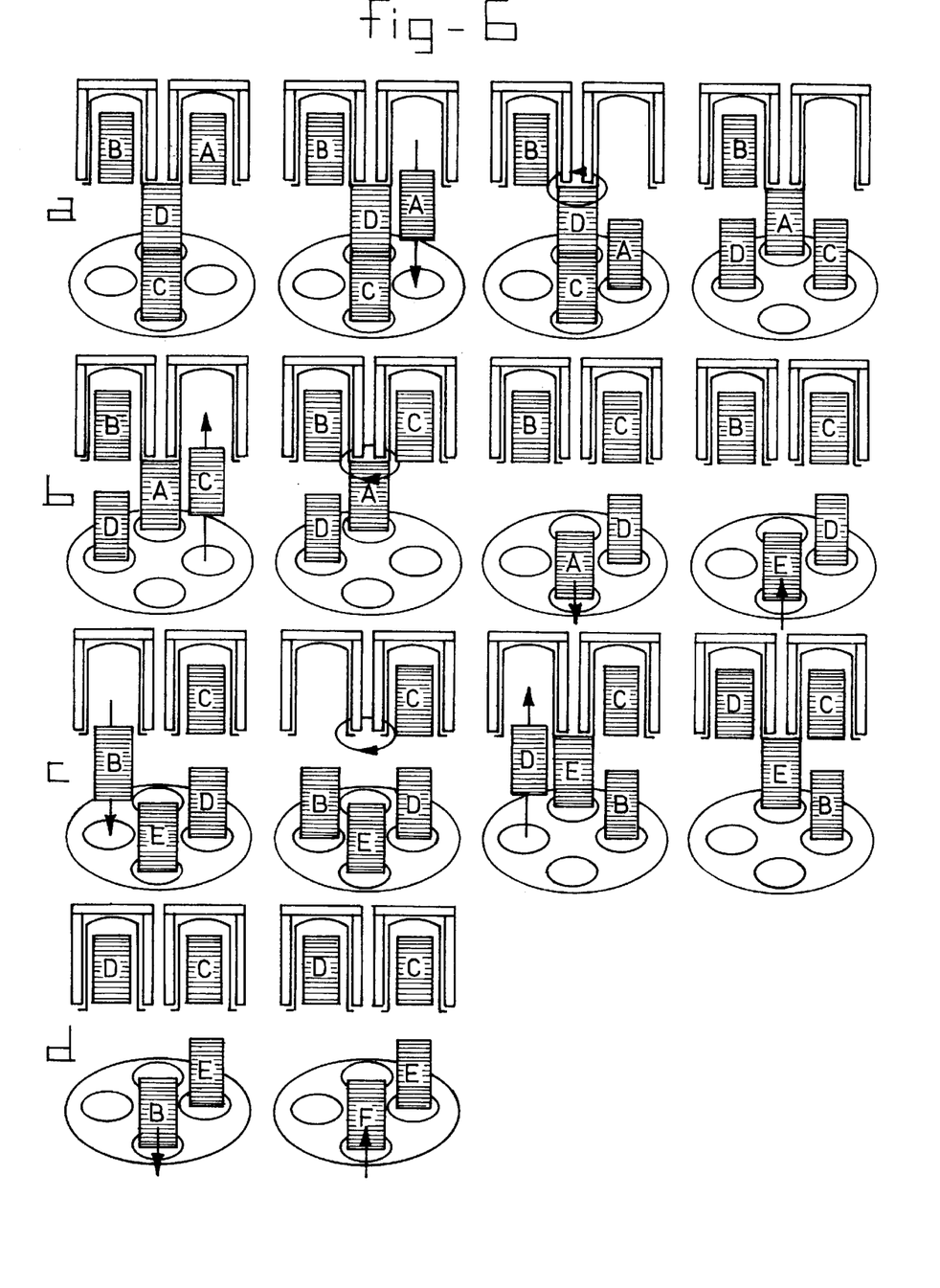
FIGS. 6a–d show another possible functioning of the same variant in accordance with FIG. 5.

FIGS. 5 and 6 diagrammatically depict a variant of the device according to the invention, in which two reactors 31 and 32 are again provided. In contrast to the designs shown previously, the turntable 33 has four positions, and the arrows indicate diagrammatically how the movement of the various boats is realized. Reference is made here to the above discussion of FIGS. 4a–c.

It should be understood that the invention described above is not limited to the variants mentioned, but also comprises designs which will strike the person skilled in the art after he/she has read the above description and which lie within the scope of the appended claims.

What is claimed is:

1. A device for processing semiconductor wafers including a processing chamber, the processing chamber comprising:
    a central distributing system for transferring wafers between a store or another processing chamber and a boat on a turntable in said processing chamber, the processing chamber configured to be closed with respect to the central distributing system;
    a first reactor arranged in the processing chamber;
    first feed and removal means for transferring the boat with the semiconductor wafers from the turntable into the first reactor;
    at least a second reactor arranged in the processing chamber; and
    second feed and removal means for transferring the semiconductor wafers from the turntable into the second reactor.

2. The device of claim 1, herein the first and second reactors are designed to carry out an identical processing.

3. The device of claim 1, wherein the first and second reactors comprise ovens.

4. The device of claim 1, wherein the turntable receives semiconductor wafers from the central distributing system and delivers them to the central distributing system, and delivers semiconductor wafers in boats to and receives from introduction means for each reactor.

5. The device of claim 4, wherein the turntable has three positions for receiving semiconductor wafers.

6. The device of claim 5, further comprising at least two processing chambers which are connectable through an airlock system.

7. The device of claim 6, wherein each processing chamber comprises at least two reactors.

8. A semiconductor processing apparatus, comprising:
    a process chamber having a first level and a second level above the first level;
    a first reactor on the second level within the process chamber;
    a first elevator configured to lift a boat containing a plurality of substrates from a first position on the first level into the first reactor on the second level;
    a second reactor on the second level within the process chamber;
    a second elevator configured to lift a boat containing a plurality of substrates from a second position on the first level into the second reactor on the second level; and
    a boat transfer mechanism within the process chamber on the first level, the boat transport mechanism configured to transfer boats within the process chamber from at least the first position to at least the second position on the first level.

9. The apparatus of claim 8, wherein the boat transfer mechanism includes a third position for boats on the first level within the process chamber.

10. The apparatus of claim 9, wherein the boat transfer mechanism includes a fourth position for boats on the first level within the process chamber.

11. The apparatus of claim 8, wherein the boat transfer mechanism transfers boats exclusively horizontally within the process chamber.

12. The apparatus of claim 11, wherein the boat transfer mechanism comprises a carousel.

13. The apparatus of claim 11, wherein the boat transfer mechanism and the first and second reactors are each configured to hold vertically oriented boats.

14. The apparatus of claim 8, wherein the boat transfer mechanism includes at least three boat holders, each of the boat holders translatable to each of the first position and the second position.

15. The apparatus of claim 8, further comprising a substrate transfer mechanism positioned outside the process chamber, the substrate transfer mechanism configured to transfer substrates from a cassette outside the process chamber into a boat within the process chamber.

16. The apparatus of claim 15, further comprising a cassette transport mechanism outside the process chamber, each of the cassette transport mechanism, the substrate transfer mechanism and the process chamber enclosed within a housing separating the apparatus from a clean room atmosphere.

17. The apparatus of claim 8, wherein the process chamber can be closed off from a mechanism for transporting substrates onto the boat transfer mechanism.

18. The apparatus of claim 17, wherein the mechanism for transporting substrates individually transfers substrates into a boat on the boat transfer mechanism.

19. A semiconductor processing system for batch processing of substrates in boats, comprising a substrate handling chamber, a boat transfer mechanism occupying a defined footprint within a process chamber sealable from the substrate handling chamber, at least two reactor vessels occupying the same defined footprint, and a boat lift mechanism for lifting boats from the boat transfer mechanism into one of the reactor vessels.

20. The system of claim 19, further comprising a second boat lift mechanism for lifting boats from the boat transfer mechanism into the other of the reactor vessels.

21. The system of claim 19, wherein the process chamber can be opened to communicate with a substrate transfer robot within the substrate handling chamber.

22. The system of claim 19, wherein the boat transfer mechanism comprising a turntable.

* * * * *